(12) United States Patent
Maegawa et al.

(10) Patent No.: US 7,338,297 B2
(45) Date of Patent: Mar. 4, 2008

(54) CONNECTOR MOUNTING CONSTRUCTION AND METHOD

(75) Inventors: Akihito Maegawa, Yokkaichi (JP); Shinyu Nagashima, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 11/604,436

(22) Filed: Nov. 27, 2006

(65) Prior Publication Data

US 2007/0123072 A1  May 31, 2007

(30) Foreign Application Priority Data

Nov. 30, 2005  (JP)  ............................. 2005-346488

(51) Int. Cl.
*H05K 1/10* (2006.01)
(52) U.S. Cl. ..................................................... 439/79
(58) Field of Classification Search ................ 439/79, 439/559, 564
See application file for complete search history.

(56) References Cited

U.S. PATENT DOCUMENTS

| | | | | |
|---|---|---|---|---|
| 3,747,378 A | * | 7/1973 | Hiatt | ........................... 174/107 |
| 4,624,309 A | * | 11/1986 | Schnatzmeyer | ............. 439/191 |
| 5,533,905 A | * | 7/1996 | Hio et al. | ................... 439/76.2 |
| 6,702,593 B2 | | 3/2004 | Ogawa | |
| 7,074,057 B2 | * | 7/2006 | Chiran et al. | .................. 439/92 |

FOREIGN PATENT DOCUMENTS

| | | |
|---|---|---|
| DE | 41 01 388 A1 | 7/1991 |
| DE | 198 48 732 A1 | 4/2000 |

* cited by examiner

*Primary Examiner*—Briggitte R. Hammond
(74) *Attorney, Agent, or Firm*—Gerald E. Hespos; Anthony J. Casella

(57) ABSTRACT

An upper end of a housing (31) is fit into a fitting hole (17) in a lid (12), and a fastenable portion (40) projects horizontally from a bottom end of the housing (31). A bolt (41) is inserted vertically through an insertion hole (42) in the fastenable portion (40) and is screwed into a bolt hole (27A) of a valve body (20) on the lid (12). An engaging groove (45) is formed near the bottom of the housing (31). A U-shaped locking plate (52) projects from the valve body (20) and is inserted into the engaging groove (45) with a clearance that permits movements of the housing (31) along directions intersecting an axis line of the housing (31) while preventing movements of the housing along the axis line. The bolt (41) is insertable into the insertion hole (42) of the fastening portion (40) while defining a clearance.

10 Claims, 9 Drawing Sheets

CONNECTOR MOUNTING CONSTRUCTION AND METHOD

BACKGROUND OF THE INVENTION

1. Field of the Invention

The invention relates to a construction and a method for mounting a connector in an apparatus or the like.

2. Description of the Related Art

An automatic transmission has a case with a lid that is formed with a connection hole. A body of a solenoid valve is mounted on the lower surface of the lid. U.S. Pat. No. 6,702,593 discloses an intermediate connector that is mounted vertically to the solenoid valve body. More particularly, a fastenable portion projects horizontally from a bottom portion of the intermediate connector and can contact the bottom surface of the solenoid valve body. An insertion hole for a bolt vertically penetrates the fastenable portion, and a seal ring is mounted at an upper end of the intermediate connector. The bolt is inserted through the insertion hole from below and is screwed into a bolt hole in the bottom surface of the valve body to fasten the intermediate connector to the valve body while the fastenable portion of the intermediate connector is placed on the bottom surface of the valve body. The upper end of the intermediate connector is fit hermetically into the connection hole of the lid. Finally, the valve body is fixed to the lower surface of the lid using another bolt or the like.

The upper end of the above-described intermediate connector cannot be fit concentrically into the connection hole unless the connection hole of the lid of the transmission case and the bolt insertion hole of the valve body are spaced apart by a proper specified distance.

The connecting hole and the bolt hole could be misaligned due to an accumulation of manufacturing dimensional tolerances of the connector, the lid of the transmission case and the valve body, as well mounting tolerances of the lid and the valve body and other tolerances. Further, the connector is likely to deform if the connector is elongated. Thus, there is also a possibility of a large deviation of the position of the insertion hole from an axis line. In this situation, the upper end of the connector may be fit into the connection hole while the axis line of the connector is deviated, and stresses may act on the connector or sealing may be impaired to cause leakage.

The invention was developed in view of the above problem, and an object thereof is to provide a mounting construction and a mounting method enabling a connector to be fitted into a mating fitting hole in a natural state.

SUMMARY OF THE INVENTION

The invention relates to a connector mounting construction for a connector that has opposite first and second ends that are spaced apart along an axis. The first end of the connector is configured to fit into a fitting hole in a first member. A fastenable portion projects from the second end of the connector in a direction intersecting the axis, and an insertion hole extends through the fastenable portion in a direction substantially parallel to the axis. The insertion hole is configured for receiving a fixing member. Thus, the fixing member can be inserted through the insertion hole and into a fixing member hole in a second member to be fixed to the first member. A partial locking mechanism is provided between the second member and the second end of the connector. The partial locking mechanism has a clearance to permit movement of the connector along one or more directions intersecting the axis. However, a partial locking mechanism engagement is provided at the first end of the second member or the second end of the connector to engage an engaging portion provided at the other.

The connector can be mounted by engaging the lock and the engaging portion of the second member with the second end of the connector for partly locking the connector into the second member. Thus, movements of the connector along the direction of the axis are prevented and movements of the connector along directions intersecting the axis are permitted. The first end of the connector that has been partly locked into the second member is fit into the fitting hole of the first member and the second member then is fixed to the first member. Finally, the fixing member is inserted through the insertion hole of the fastenable portion of the connector and into the fixing member hole of the second member to fix the fastenable portion to the second member.

A distance between the fitting hole and the screw hole could deviate from a specified distance due to accumulated dimensional tolerances in forming the connector, the first member and the second member, and mounting tolerances of the first and second members and other tolerances. Similarly, the position of the insertion hole of the fastenable portion could deviate a large amount from the axis line due to a deformation.

However, a final operation of the mounting procedure of the connector of the invention is to fasten the fastenable portion to the second member with the fixing member. In this case, the insertion hole of the fastenable portion and the fixing member hole of the second member need to be aligned. It is possible to align the insertion hole and the fixing member hole while moving the connector in a direction intersecting the axis line by utilizing the clearance in the partial locking mechanism, and then to fasten the connector with the screw. In other words, the second end of the connector can be fastened to the second member with the fixing member while the first end of the connector is fit in the fitting hole of the first member in the vertical posture of the connector where the axis line is not deviated from vertical direction. Thus, the action of a bending stress on the connector can be avoided, and the first end of the connector can be prevented from being forcibly fit in the fitting hole.

The fixing member preferably comprises a screw and the fixing member hole comprises a screw hole into which the screw can be screwed.

The clearance in the insertion hole of the fastenable portion enables a positional displacement between the fitting hole and the fixing member hole and permits a larger deviation of the position of the insertion hole.

The partial locking mechanism preferably includes an engaging groove formed circumferentially on the outer surface of the second end of the connector and a locking plate that projects from the second member for insertion into the engaging groove in a direction intersecting the axis.

The locking plate and the engaging groove preferably are arranged to define the clearance for permitting movements of the connector along directions intersecting the axis. The locking plate preferably projects from the second member and is inserted into the engaging groove to define the clearance between the locking plate and the bottom of the engaging groove. Thus, the connector can be locked partly while preventing movements of the connector along the direction of the axis. However, movements along directions intersecting the axis line are permitted.

The invention also relates to a connector mounting method for fitting a first end of a connector into a fitting hole in a first member. The method includes inserting a fixing member through an insertion hole in a fastenable portion that projects from the second end of the connector in a direction intersecting the axis. The method then includes inserting the fixing member into a fixing member hole in a second member for fixing the first member to the second member for permitting movements of the connector along directions intersecting the axis while preventing movements of the connector along the direction of the axis. More particularly, the method includes engaging a lock at one of the second member and the second end of the connector to an engaging portion provided at the other, fitting the first end of the connector into the fitting hole of the first member, fixing the second member to the first member, and inserting the fixing member into the fixing member hole of the second member through the insertion hole of the fastenable portion.

The step of inserting the fixing member preferably comprises screwing a screw into a screw hole of the second member through the insertion hole of the fastenable portion.

The step of inserting the fixing member preferably is carried out by inserting the fixing member into the insertion hole of the fastenable portion while defining a clearance thereto.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 4:
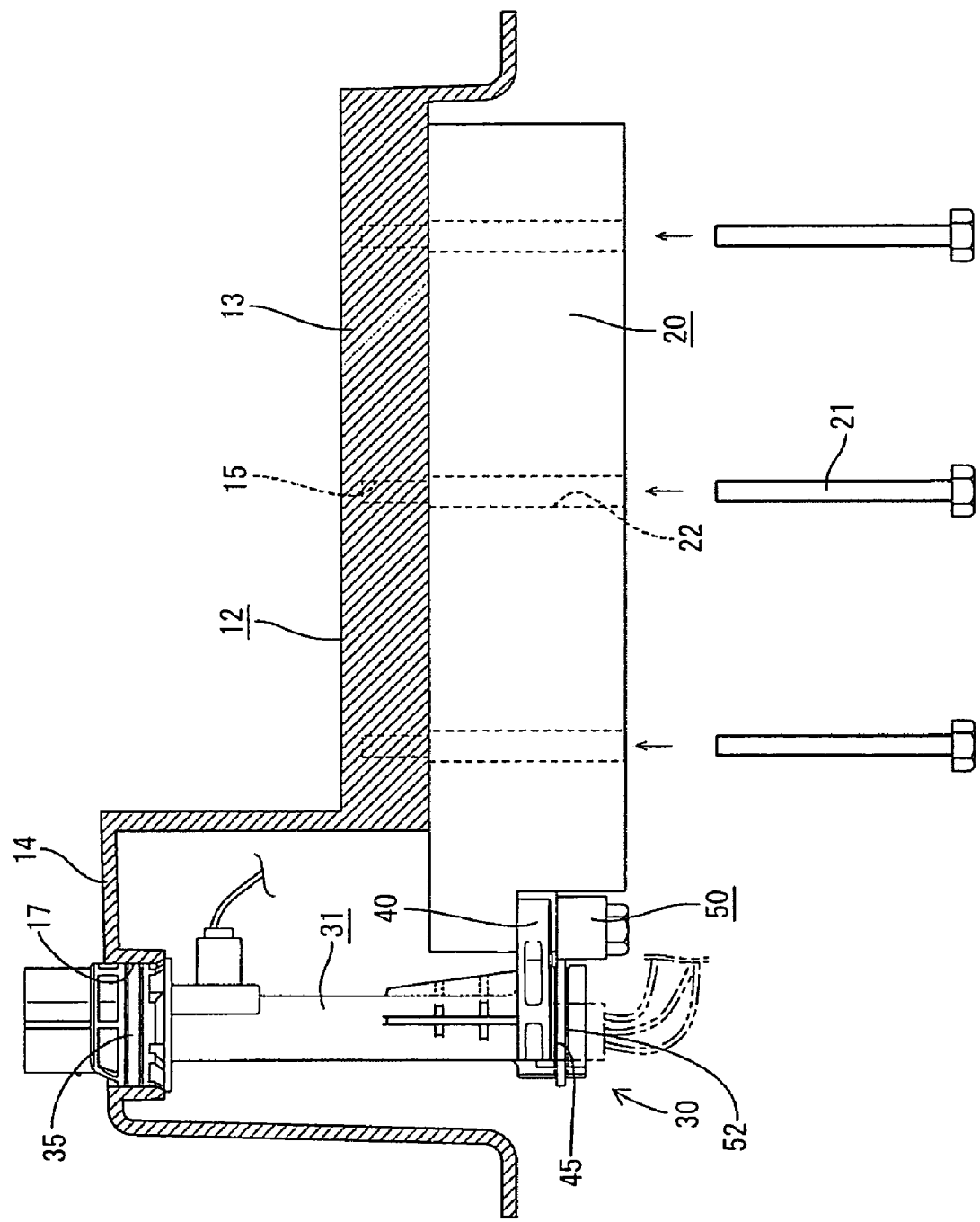
FIG. 4 is a front view partly in section showing an operation of fixing a valve body to the lid.
Figure 5:
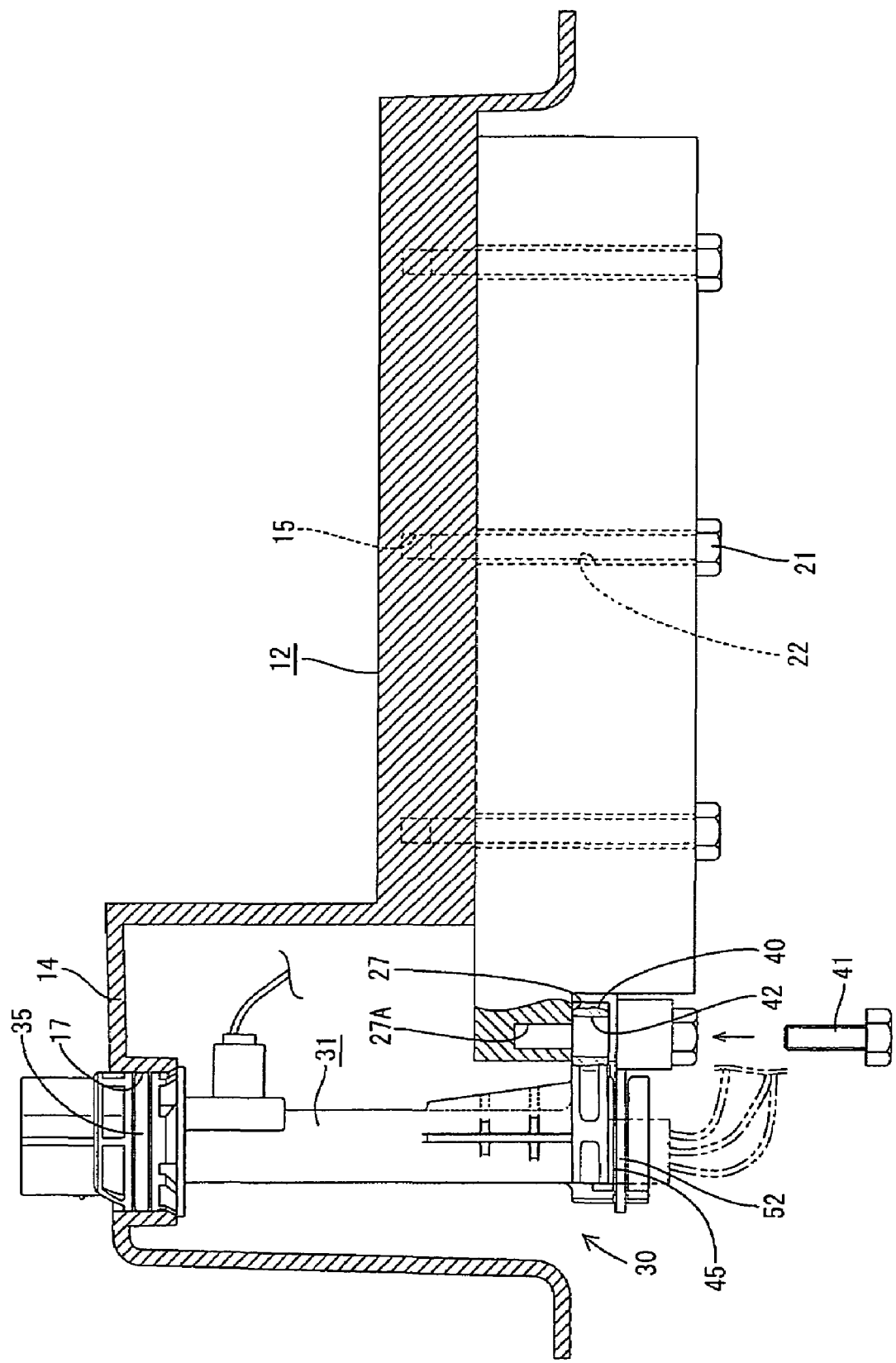
FIG. 5 is a front view partly in section showing an operation of fastening a fastenable portion of the housing to the valve body.
Figure 6:
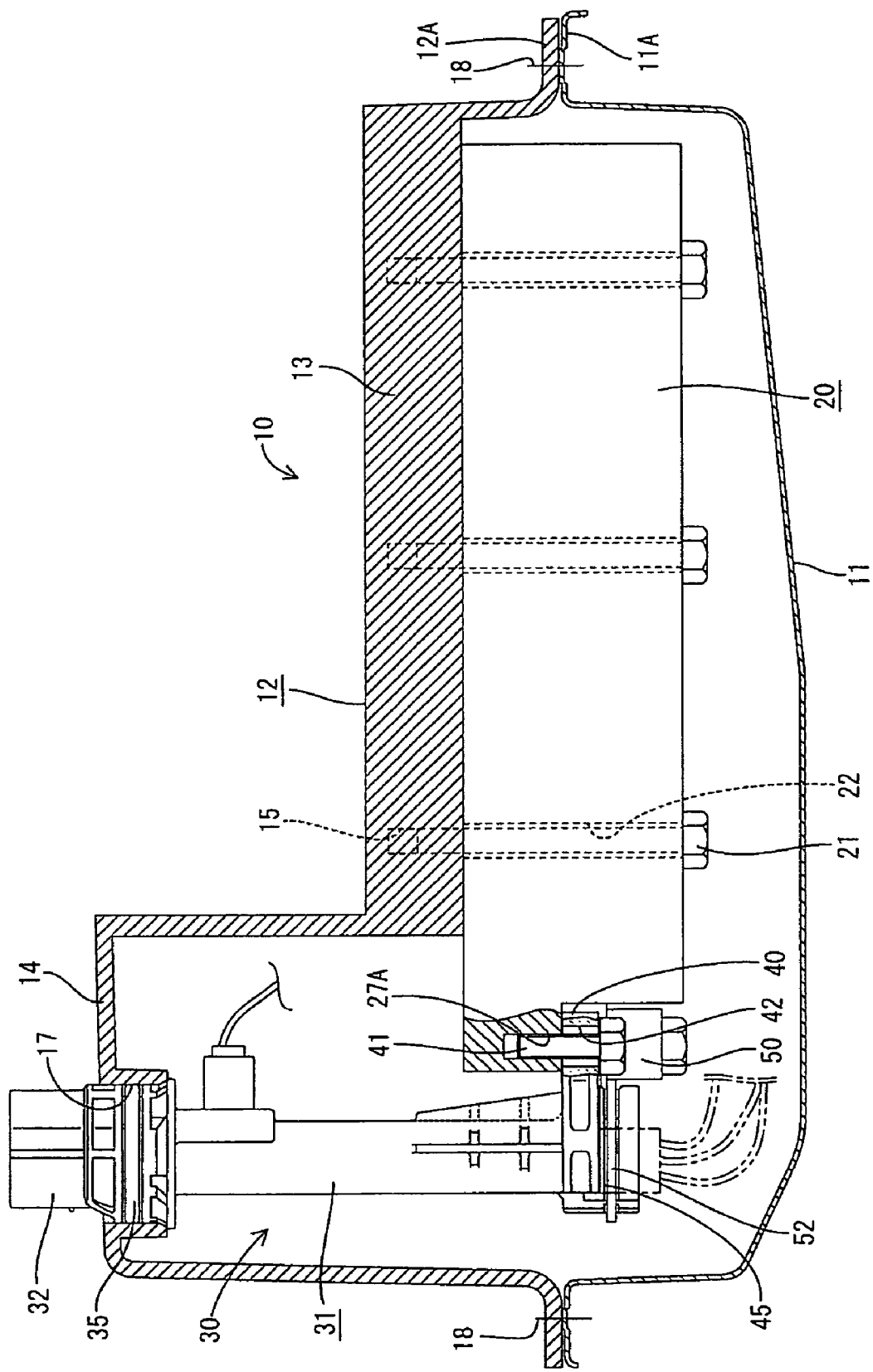
FIG. 6 is a front view partly in section when the assembling of the transmission is completed.

A construction in accordance with the invention is illustrated in FIGS. 1 to 9 and is used for mounting an intermediate connector 30 to an automatic transmission case 10. The transmission case 10 is made e.g. of a metal or alloy and has an upwardly open pan-shaped main body 11, as shown in FIG. 6. A lid 12, made e.g. of synthetic resin, is mounted over the opening in the main body 11. The lid 12 has a lower portion 13 and an elevated portion 14. The lower portion 13 preferably extends across more than about half of the area of the lid 12 and more preferably about two-thirds of the area of the lid 12 at one side at one side of the lower portion 13. The lower portion 13 is thick and a valve body 20 is mounted on the lower surface of the lower portion 13.

The valve body 20 is substantially block-shaped and is made e.g. of synthetic resin. Additionally, the valve body 20 is dimensioned to extend across substantially the entire area of the lower portion 13 and slightly into the elevated portion 14. Bolts 21 are inserted from below through insertion holes 22 in the valve body 20 and are screwed into bolt holes 51 in the lower surface of the lower portion 13 to fix the valve body 20 to the lower portion 13.

Figure 3:
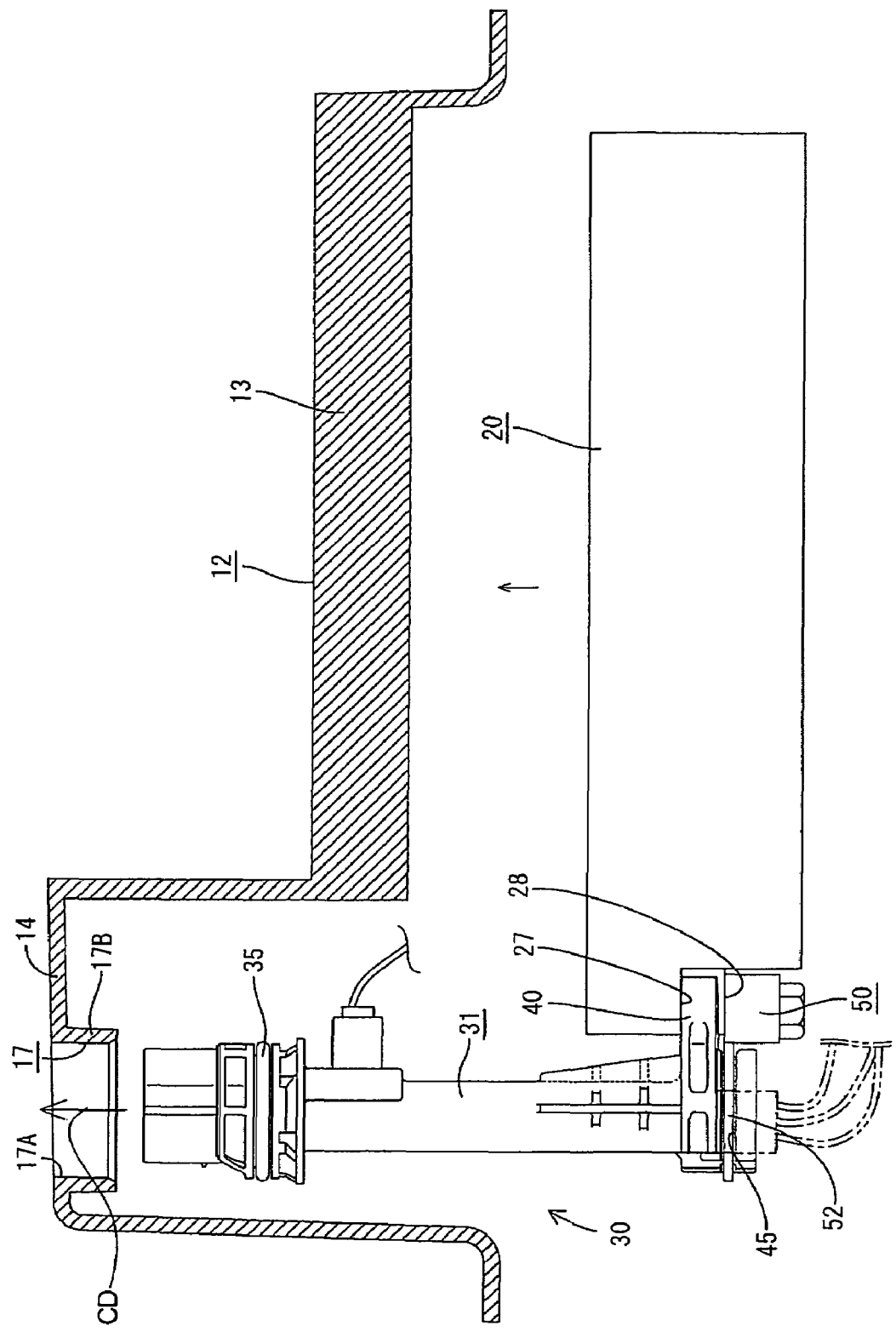
FIG. 3 is a front view partly in section showing an operation of fitting an upper end portion of the housing into a fitting hole of a lid.

A fitting hole 17 is formed in the elevated portion 14, as shown in FIG. 3. A substantially round mating hole 17A is defined by the upper opening edge of the fitting hole 17 and a substantially cylindrical wall 17B extends continuously down from the mating hole 17A.

An outwardly projecting flange 11A is formed around the periphery of the upper opening of the case main body 11 and an outwardly projecting flange 12A is formed around the lower periphery of the lid 12. The flanges 11A and 12A project substantially equal distances. The flange 12A of the lid 12 is placed on the flange 11A of the case main body 11 and is coupled thereto by screws 18 to mount the lid 12 on the upper surface of the case main body 11.

Figure 1:
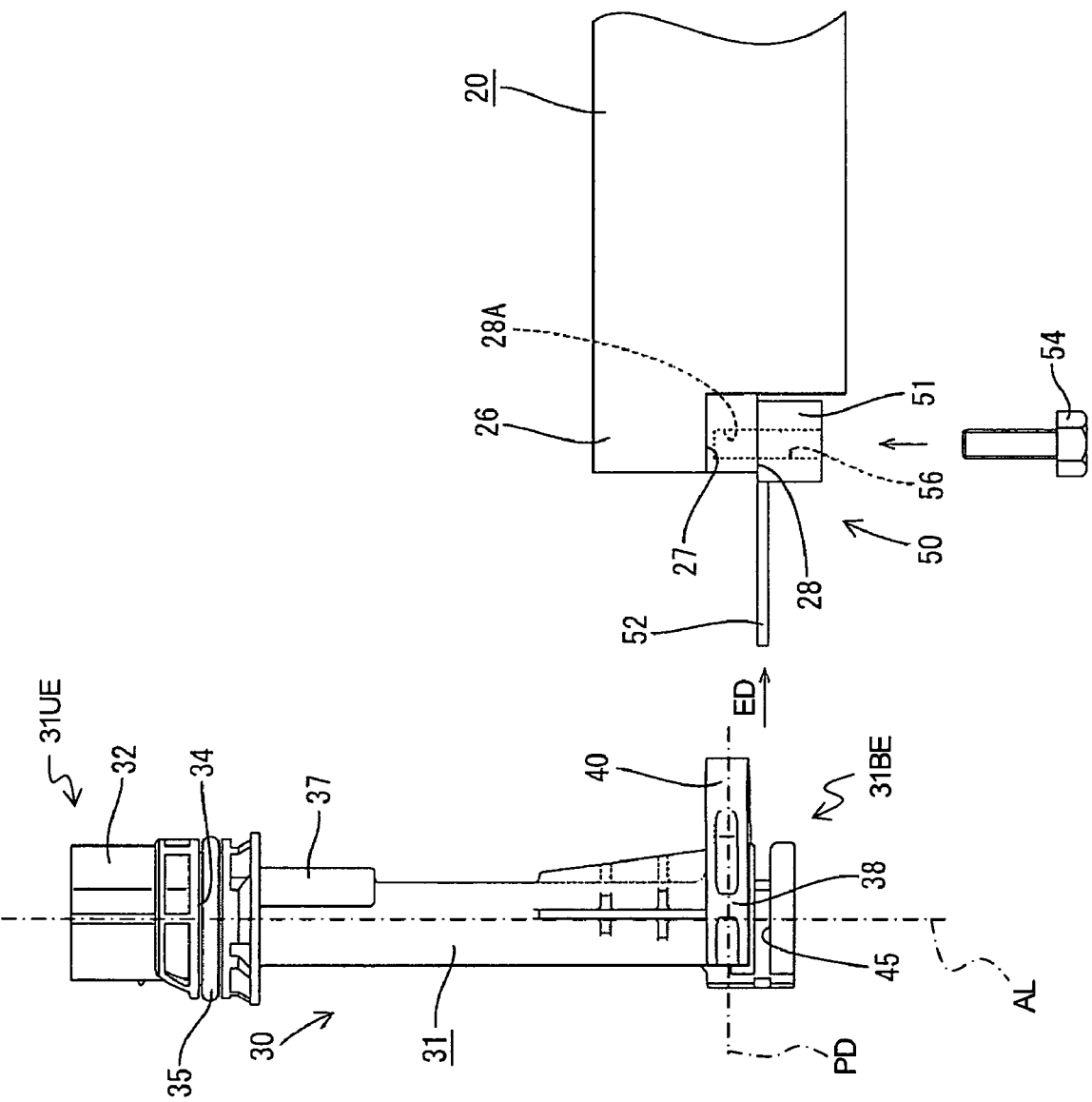
FIG. 1 is a front view showing an operation of partly locking a housing according to one embodiment of the present invention.

As shown in FIG. 1, the intermediate connector 30 has a vertically long housing 31 made e.g. of synthetic resin. An upper end 31UE of the housing 31 is configured to fit in the fitting hole 17 of the lid 12 of the transmission case 10. An external connector 32 faces up at the upper end 31UE of the housing 31 and can connect with a connector (not shown) arranged outside. A seal-ring mounting groove 34 is formed over the entire outer peripheral surface at the bottom of the external connector 32, and a seal ring 35 is mounted therein. Sealing is achieved by fitting the external connector 32 into the fitting hole 17 while resiliently compressing the seal ring 35.

A first internal connector 37 projects forward from the plane of FIG. 1 at a position on the housing 31 near the upper end 31UE, and a mating connector 24 (see FIG. 2) drawn out from the valve body 20 is connectable with the first internal connector 37 from the right side of FIG. 1. Further, a second internal connector 38 projects forward from the plane of FIG. 1, and another connector 25 (see FIG. 2) drawn out from the valve body 20 is connectable with second internal connector 38 from below.

A fastenable portion 40 is formed at the bottom end 31BE of the housing 31 and projects laterally in a projecting direction PD that intersects the longitudinal axis line AL of the housing 31. The fastenable portion 40 is a thick plate that is unitary with part of the second internal connector 38 and enables the bottom end 31 BE of the housing 31 to be fixed to the valve body 20.

A mounting portion 26 projects from an upper part of the left end surface of the valve body 20 in FIG. 1. The lower surface of the mounting portion 26 is stepped so that the front end thereof is higher and the back end thereof is lower. The fastenable portion 40 of the housing 31 contacts a higher mounting surface 27 at the higher front end and a bracket 50 can be mounted on a mounting surface 28 at the back end, as described below.

Figure 7:
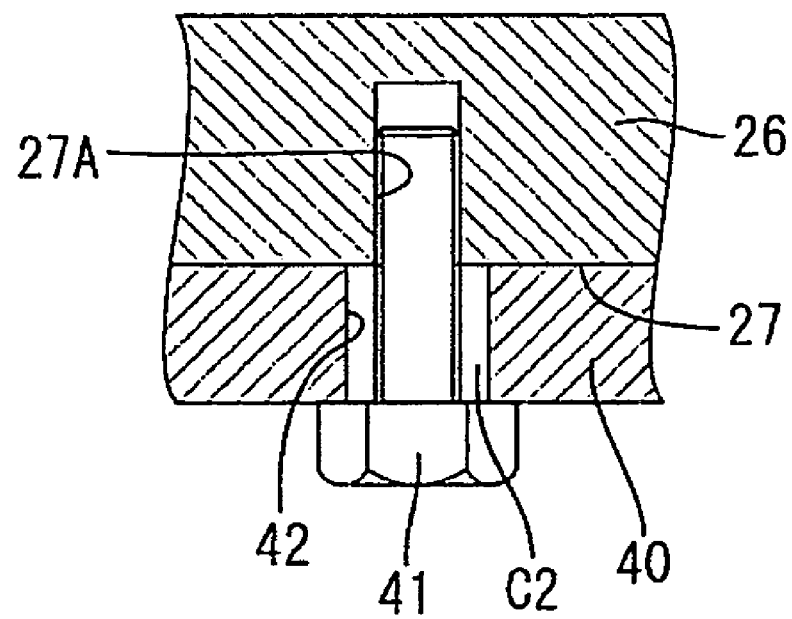
FIG. 7 is a section showing a construction for fastening the fastenable portion.

An insertion hole 42 penetrates the fastenable portion 40 of the housing 31 in the vertical direction, as shown in FIGS. 6 and 7. A bolt 41 can be inserted through the insertion hole 42 and can be screwed into a bolt hole 27A in the higher mounting surface 27 of the valve body 20. The housing 31 can be aligned in a straight posture so that the axis line AL extends substantially vertically. In this orientation, the upper end 31UE of the housing 31 can fit into the fitting hole 17 of the lid 12. Additionally, the fastenable portion 40 closely contacts the higher mounting surface 27 of the valve body 20 and the insertion hole 42 and the bolt hole 27A align substantially concentrically.

The diameter of the insertion hole 42 for the bolt 41 exceeds the diameter of the shaft of the bolt 41 to define a relative clearance C2, as shown in detail in FIG. 7.

Figure 8:
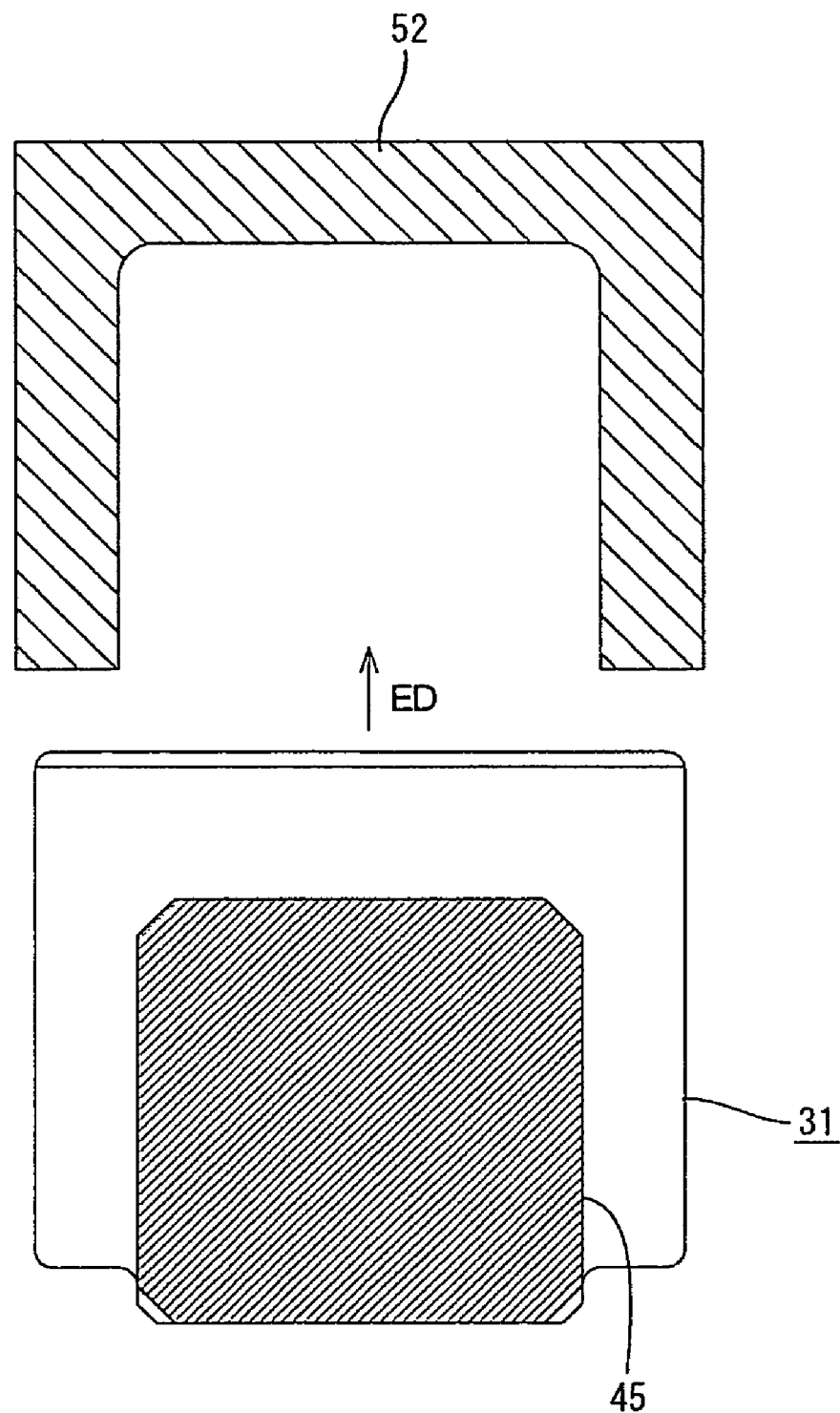
FIG. 8 is a plan view in section showing a partly locking operation.

The bottom end 31BE of the housing 31 is coupled to the valve body 20 before the fastenable portion 40 of the housing 31 is fixed to the valve body 20. More particularly, the bottom end 31BE of the housing 31 is substantially rectangular and an engaging groove 45 is formed in three surfaces substantially adjacent the fastenable portion 40, as shown in FIG. 8. The engaging groove 45 is formed in the right, front and back surfaces, as shown in FIG. 1. The surface where the engaging groove 45 is not formed is at a side substantially opposite to the valve body 20 when the fastenable portion 40 is placed on the higher mounting surface 27.

A bracket 50 is to be mounted on the valve body 20 and has a synthetic resin body 51. A substantially U-shaped metal locking plate 52 is insert molded in the body 51 and projects from an upper end of the body 51. The locking plate 52 has a substantially U-shape, as shown in FIG. 8, and is insertable into the engaging groove 45 of the housing 31.

An insertion hole 56 is formed through the body 51 and a bolt hole 28A is formed in the lower mounting surface 28. The bracket 50 is oriented so that an opening of the locking plate 52 faces laterally to the left of FIG. 1. A bolt 54 then is inserted through the insertion hole 56 and into the bolt hole 28A to secure the body 51 of the bracket 50 to the lower mounting surface 28 of the valve body 20. With the housing 31 in the vertical posture and fit in the fitting hole 17, the locking plate 52 of the bracket 50 is inserted into the engaging groove 45 of the housing 31 in a direction substantially normal to the axis line and from the right in FIG. 1.

Figure 9:
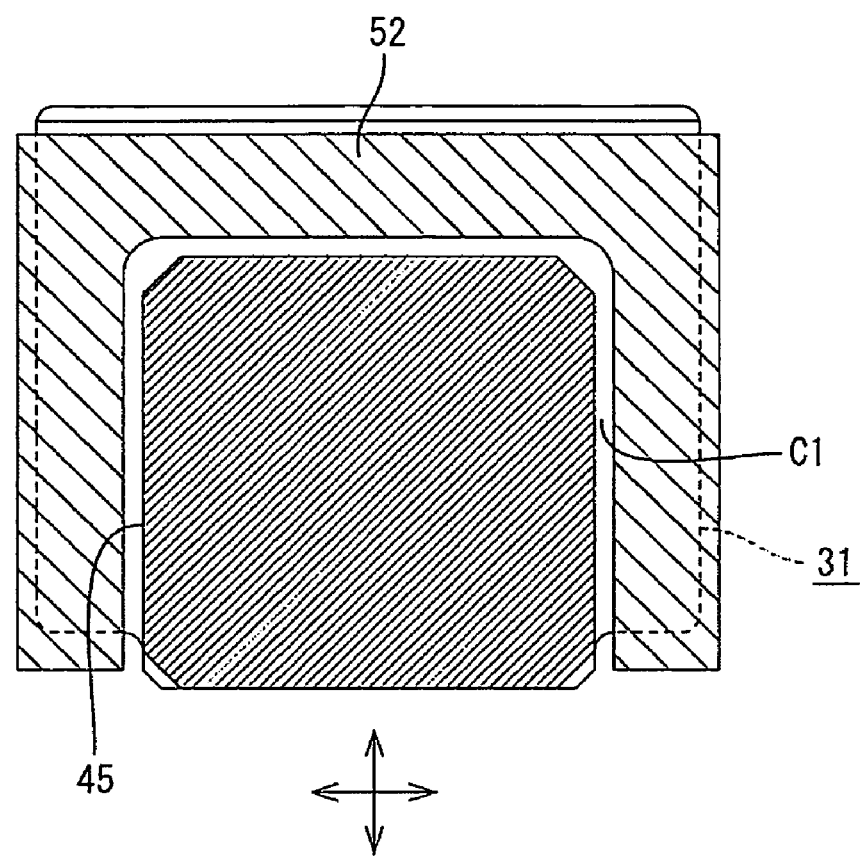
FIG. 9 is a plan view in section showing a partly locked state.

The locking plate 52 is only slightly thinner than the width of the engaging groove 45. Thus, the locking plate 52 is received closely in the engaging groove 45 to restrict vertical movements of the housing 31 along the axis line AL. On the other hand, the clearance C1 exists in directions normal to the axis line AL of the housing 31 between the three inner edges of the locking plate 52 and the corresponding three sides of the engaging groove 45, as shown in FIG. 9. Therefore the housing 31 can move normal to the axis line AL of the housing 31 while the locking plate 52 is in the engaging groove 45.

A partial locking mechanism comprises the locking plate 52 of the bracket 50 and the engaging groove 45 in the housing 31.

Figure 2:
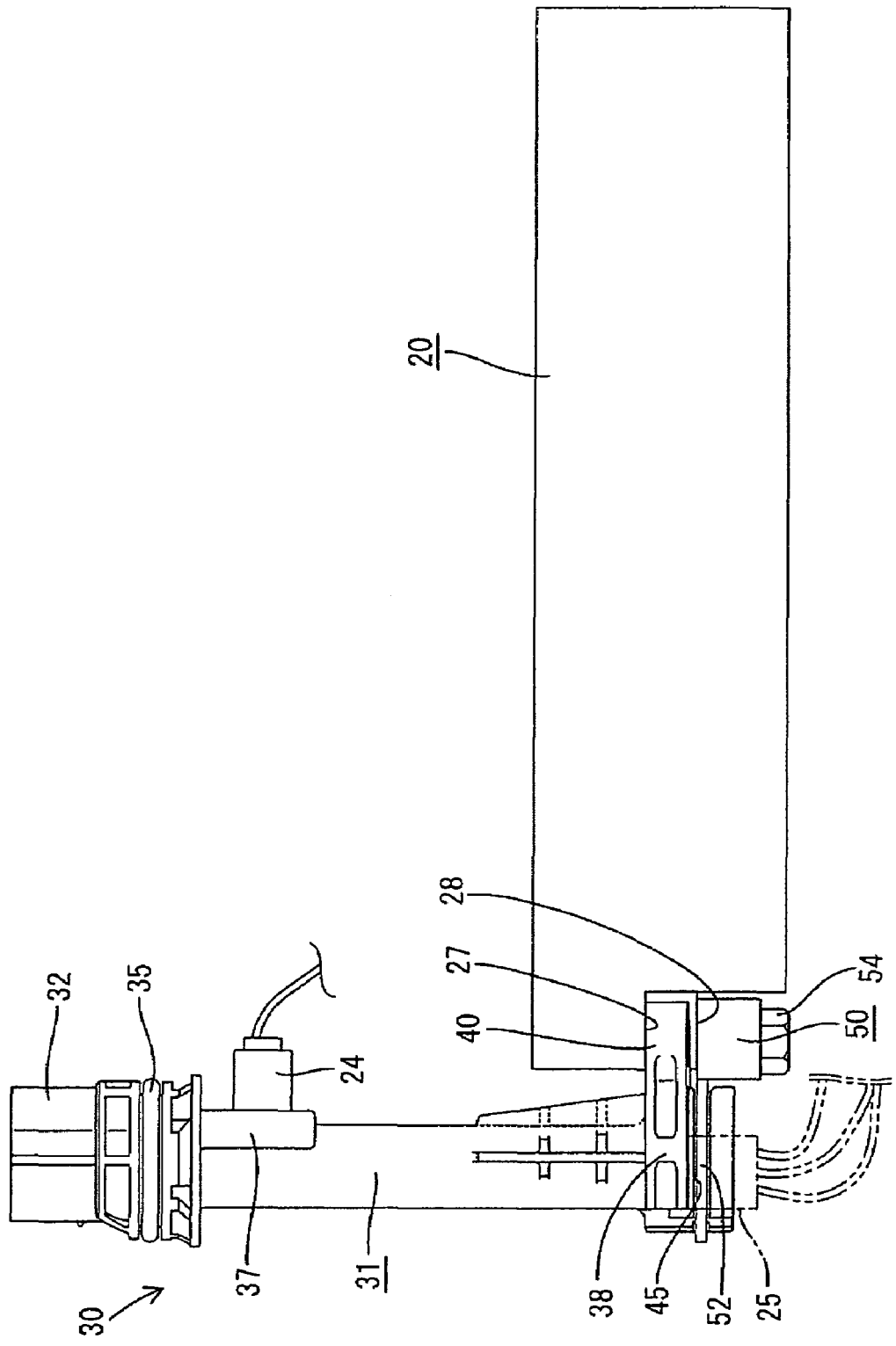
FIG. 2 is a front view showing a state where the housing is partly locked.

The intermediate connector 30 is mounted by placing the body 51 of the bracket 50 in contact with the lower mounting surface 28 of the valve body 20 as shown in FIG. 1. The bolt 54 then is screwed into the bolt hole 28A from the lower surface of the body 51. As a result, the locking plate 52 is fixed to face to the left of FIG. 1 and substantially normal to the axis line. The engaging groove 45 at the bottom end 31 BE of the housing 31 then is engaged with the inner side of the locking plate 52 in an engagement direction ED aligned substantially normal to the axis line AL, as shown by arrows of FIGS. 1 and 8, and the fastenable portion 40 is placed along the higher mounting surface 27 of the valve body 20, as shown in FIG. 2.

In this way, the housing 31 is partly locked to the bracket 50 of the valve body 20 so that movements of the housing 31 along the axis line AL are restricted. However, movements of the housing 31 along directions normal to the axis line AL are permitted. In this partly locked state, the mating connectors 24, 25 drawn out from the valve body 20 can be connected with the internal connectors 37, 38.

The upper end 31UE of the housing 31 next is fit into the fitting hole 17 of the lid 12 in the connecting direction CD and along the axis line AL, as shown in FIG. 3, while resiliently compressing the seal ring 35. The valve body 20 then is brought into contact with the lower surface of the lower portion 13 of the lid 12.

The bolts 21 are inserted through the insertion holes 22 of the valve body 20 from below and are screwed into the bolt holes 15 in the lower surface of the lower portion 13, as shown in FIG. 4, to fix the valve body 20 to the lower surface of the lower portion 13.

Finally, the insertion hole 42 of the fastenable portion 40 of the housing 31 is aligned with the bolt hole 27A in the higher mounting surface 27. The bolt 41 then is inserted up through the insertion hole 42, and is screwed into the bolt hole 27A to fix the housing 31, as shown in FIG. 5.

Thereafter, as shown in FIG. 6, the flange 12A of the lid 12 is placed on the flange 11A of the case main body 11 while the valve body 20 and the housing 31 are mounted on the lid 12. The lid 12 is fastened at plural positions using the screws 18 to be fixedly mounted on the upper surface of the case main body 11 and to complete the assembling of the transmission case 10.

The upper end 31UE of the housing 31 may not align with the fitting hole 17 of the lid 12 and/or the insertion hole 42 of the fastenable portion 40 may not align with the bolt hole 27A in the higher mounting surface 27 of the valve body 20. These misalignments could be attributable to a sum of the dimensional tolerances in forming the housing 31, the lid 12 and the valve body 20, the mounting tolerances of the lid 12 and the valve body 20 as well as other tolerances. Similarly, the insertion hole 42 of the fastenable portion 40 could deviate significantly from the axis line AL of the housing 31 due to a deformation, such as a deflection resulting from the elongated shape of the housing 31.

In this embodiment, a final operation uses the bolt 41 to fasten the fastenable portion 40 to the valve body 20. Accordingly, the insertion hole 42 of the fastenable portion 40 and the bolt hole 27A in the higher mounting surface 27 of the valve body 20 must be aligned substantially concentrically. However, the clearance C1 between the locking plate 52 and the engaging groove 45 enables the insertion hole 42 to be aligned with the bolt hole 27A while moving the housing 31 along a direction intersecting the axis line AL of the housing 31, as shown by arrows of FIG. 9. The bolt 41 then can be tightened. In other words, the bottom end 31BE of the housing 31 can be fastened to the valve body 20 while the upper end 31UE of the housing is fit in the fitting hole 17 of the lid 12 and with the axis line AL of the housing 31 aligned in the vertical direction. Thus, bending stress on the housing 31 is avoided to improve durability and the like. Further, the upper end 31UE of the housing 31 having the seal ring 35 mounted thereon need not be fit forcibly in the fitting hole 17. Accordingly, the seal ring 35 is compressed substantially evenly over the entire inner circumferential surface of the fitting hole 17 to ensure good sealing.

Further, the bolt 41 is insertable into the insertion hole 42 of the fastenable portion 40 while defining a clearance C2, as shown in FIG. 7. The clearance C2 enables a positional displacement between the fitting hole 17 and the bolt hole 27A and/or a deviation of the insertion hole 42 with respect to the bolt hole 27A to be taken up in a wider range.

Further, an angular deviation of the axes of the insertion hole 42 and the bolt hole 27A also can be dealt with.

The invention is not limited to the above described and illustrated embodiment. For example, the following embodiment is also embraced by the technical scope of the present invention as defined by the claims. Beside the following embodiment, various changes can be made without departing from the scope and spirit of the present invention as defined by the claims.

The extra clearance in the insertion hole of the fastenable portion is unnecessary if the positional displacement between the fitting hole of the lid and the bolt hole of the valve body and the deviation of the insertion hole of the fastenable portion from the bolt hole 27A can be taken up only by the clearance in the partial locking mechanism.

The partial locking mechanism is not limited to the construction shown in the foregoing embodiment to insert the locking plate into the engaging groove. Another construction may be employed provided that a clearance is provided to permit movements of the housing along directions intersecting the axis line of the housing while movements of the housing along the direction of the axis line thereof are prevented upon the engagement of the locking portion at one of the valve body and the bottom end portion of the housing with the engaging portion provided at the other.

The invention is not limited to application to the intermediate connector to be mounted in the automatic transmission as described and shown in the foregoing embodiment. Rather, the invention is applicable to intermediate connectors to be mounted in other devices and connectors used for other purposes, such as junction boxes, instrument panels or any other electric or electronic device or appliance. In short, the invention is widely applicable to mounting constructions in general in which one end of a connector is fit into a fitting hole of a first member and a fastenable portion projecting at or near the other end of the connector is fixed to a second member to be fixed to the first member by screwing a bolt in a direction substantially parallel to the direction of the axis line of the connector.

What is claimed is:

1. A connector mounting construction, comprising:
    a connector having opposite first and second ends spaced from one another along an axis line, the first end being configured for fitting into a fitting hole in a first member;
    a fastenable portion projecting from the second end of the connector in a direction intersecting the axis line, the fastenable portion being formed with an insertion hole, a fixing member being insertable through the insertion hole in a direction substantially parallel to the axis line and being engageable in a fixing member hole formed in a second member for fastening the connector thereto; and
    a partial locking mechanism between the second member and the second end of the connector and having a clearance for permitting movements of the connector along at least one direction intersecting the axis line, while preventing movements of the connector along the axis line upon engagement of a lock at one of the second member and the second end of the connector with an engaging portion provided at the other of the second member and the second end of the connectors, the partial locking mechanism including an engaging groove formed on an outer surface of the second end of the connector, and a locking plate projecting from the second member and insertable into the engaging groove in a direction intersecting the axis line.

2. The connector mounting construction of claim 1, wherein the fixing member comprises a screw and the fixing member hole comprises a screw hole into which the screw can be screwed.

3. The connector mounting construction of claim 1, wherein the fixing member is insertable into the insertion hole of the fastenable portion while defining a clearance thereto.

4. The connector mounting construction of claim 1, wherein the locking plate and the engaging groove are arranged to define the clearance therebetween for permitting movement of the connector along the directions intersecting the axis line.

5. A construction for use with a first member having a filling hole extending along an axis line and a second member having fixing hole extending parallel to and offset from the axis line, comprising:
    a fastenable portion having an insertion hole extending therethrough in a direction substantially parallel to the axis line, the insertion hole being aligned with the fixing hole in the second member, a locking plate spaced from the insertion hole along a direction normal to the axis line; and
    a connector having opposite first and second ends spaced from one another along the axis line, the first end being fit into the fitting hole in the first member, an engaging groove in proximity to the second end of the connector and aligned substantially normal to the axis line, the engaging groove engaging the locking plate for permitting movement of the connector along at least one direction normal to the axis line, while substantially preventing movements of the connector along the axis line.

6. The construction of claim 5, further comprising a fixing member insertable through the insertion hole and being engageable in the fixing hole in the second member.

7. The construction of claim 6, wherein the fixing member is a screw.

8. The construction of claim 7, wherein the screw is insertable into the insertion hole of the fastenable portion while defining a clearance thereto.

9. The construction of claim 5, wherein the engaging groove is formed in at least two opposite sides of the second end of the connector.

10. The construction of claim 9, wherein the locking plate is substantially U-shaped and is configured for engaging the engaging groove at the opposite sides of the second end of the connector.

* * * * *